United States Patent [19]

Ferris et al.

[11] Patent Number: 4,697,103

[45] Date of Patent: Sep. 29, 1987

[54] LOW POWER HIGH CURRENT SINKING TTL CIRCUIT

[75] Inventors: David A. Ferris, West Buxton; Daniel J. DeSimone, Buxton, both of Me.

[73] Assignee: Quadic Systems, Inc., South Portland, Me.

[21] Appl. No.: 838,519

[22] Filed: Mar. 10, 1986

[51] Int. Cl.[4] .................. H03K 19/088; H03K 17/16; H03K 19/00; H03K 3/26

[52] U.S. Cl. ........................... 307/456; 307/443; 307/454; 307/473; 307/300; 307/315

[58] Field of Search ............... 307/443, 456, 300, 473, 307/315, 454

[56] References Cited

U.S. PATENT DOCUMENTS

| | | | |
|---|---|---|---|
| 4,321,490 | 3/1982 | Bechdolt | 307/443 |
| 4,369,380 | 1/1983 | Menniti et al. | 307/300 |
| 4,454,432 | 5/1984 | Wood | 307/456 |

*Primary Examiner*—Stanley D. Miller
*Assistant Examiner*—M. R. Wambach

[57] ABSTRACT

A multi-terminal transistor circuit structure is described for TTL applications including current sinking and "pull-down" transistor circuit elements. A transistor pair is coupled with the emitter of the second transistor coupled to the base of the first transistor. The collector and emitter of the first transistor provide first and second terminals and the bases of the transistor pair provide independent third and fourth terminals or current controlled inputs. The new circuit structure is incorporated in a tranistor transistor logic (TTL) output buffer circuit and provides first and second pull-down transistor elements having the emitter of the second transistor coupled to the base of the first pull-down transistor. An independent base drive is coupled to the base of the second pull-down transistor element. The second stage pull-down transistor element introduces full square law enhancement of $\beta^2$ amplification of the output sinking current in a high current sinking mode while eliminating prior art feedback diodes and dual phase splitter transistors. The separate input and base drive coupling to the base of the additional pull-down avoids "current hogging" of the base drive by the phase splitter transistor. The circuit is applicable in both TTL bistate and tristate devices and is characterized by low power dissipation, low output impedance and high current sinking capability.

14 Claims, 11 Drawing Figures

LOW POWER HIGH CURRENT SINKING TTL CIRCUIT

TECHNICAL FIELD

This invention relates to a new multi-terminal transistor circuit structure for transistor-transistor logic (TTL) applications including current sinking and "pull-down" circuit elements and to improved TTL output circuit devices for both bistate and tristate operation. The invention is particularly suited for applications with large output capacitance such as common bus transmission lines, and is characterized by low power dissipation, low output impedance and high current sinking capability.

BACKGROUND ART

A conventional TTL output circuit or buffer commonly used in TTL output devices is illustrated in FIG. 1. The output buffer circuit 10 delivers binary logic output signals $V_0$ of high or low potential at the signal output 12 in response to binary logic signals $V_1$ of low or high potential at the signal input 14. The Darlington transistor pair Q4 and Q4A constitute the pull-up transistor element for sourcing current to the signal output 12 from high potential source $V_{CC}$ for establishing a high potential or logic high level signal $V_{OH}$ at the output 12. Pull-down transistor element Q3 sinks current from the signal output 12 to low potential or ground for establishing a low potential or logic low level output signal $V_{OL}$ at the output 12. Resistor R3 and diode SD3 provide an effective squaring network for giving the circuit a square transfer curve. The respective conducting states of the pull-up and pull-down transistor elements are controlled by the phase splitter transistor element Q2.

The feedback diode SD1 provides a large current sinking capability for transition at the output from high to low potential. Feedback diode SD2 drains the base of pull-up transistor Q4. The feedback current from the output through Schottky diode SD1 is received by phase splitter transistor Q2 and applied to the base of pull-down transistor Q3. As further explained, the increased output sinking current through pull-down transistor Q3 by reason of the feedback diode SD1 is proportional to $\beta^2$ during the transition from high to low logic level at the signal output 12, where $\beta$ is the transistor gain.

The TTL output circuit 10 is inherently inverting. When a low potential or low logic level input signal $V_I$ appears at the signal input 14, the base drive current $I_1$ to phase splitter transistor Q2 through base drive resistor R1 and input transistor Q1 is diverted by input transistor Q1 and the phase splitter transistor Q2 is non-conducting. Pull-down transistor Q3 is therefore also non-conducting. Base drive current from power supply $V_{CC}$ passes through resistor R2 to the respective bases of the pull-up transistor element, Darlington transistor pair Q4A and Q4, delivering a logic high level or high potential at the signal output 12.

A high level or high potential signal at the signal input 14 results in a transition from high to low potential at the signal output 12. Base drive current $I_1$ is delivered through input transistor Q1 turning on the phase splitter transistor Q2 which in turn delivers base drive current $I_4$ to the pull-down transistor element Q3. With phase splitter transistor Q2 and pull-down transistor Q3 conducting, the base drive current is diverted from the pull-up transistor element Darlington pair and the pull-up transistor element is non-conducting. Pull-down transistor element Q3 sinks current from the signal output 12 and a low level or low potential signal $V_{OL}$ appears at the signal output 12.

A graph of the output current vs. voltage (I–V) characteristic in the low state at the signal output 12 is illustrated in FIG. 1A. There are five distinct regions in this graph. The first region, which is not of particular interest to this discussion. Is at $I_{OL}=0$ along the horizontal axis before the first bend in the I–V curve. This is the offset region of the pull-down transistor element Q3. After the first bend in the curve is Region II of the characteristic curve which is the saturation region of pull-down transistor element Q3. The output characteristic has a low impedance in this region since the output voltage $V_{OL}$ changes very little in this region as the output current $I_{OL}$ is increased. The corresponding output voltage is:

$$V_{01} \approx V_{SAT}Q3. \tag{1}$$

As the output current is further increased, the output characteristic enters a high impedance region where the output current increases very little as the output voltage is increased. This is Region III and corresponds to the linear region of the pull-down transistor element Q3. The corresponding output current in this case is:

$$I_{01} = \beta I_4, \tag{2}$$

where $\beta$ is the current gain of the pull-down transistor element Q3.

As the output voltage increases, a voltage is reached that will forward bias the feedback Schottky diode SD1. This allows current to pass through the Schottky diode into the collector of phase splitter transistor Q2 and subsequently through the emitter of Q2 into the base of Q3. This is Region IV of the output low state I–V characteristic curve. It is a low impedance region in which the output voltage is given by the expression:

$$V_{02} = V_{BE}Q3 + V_{SAT}Q2 + V_{SD1}. \tag{3}$$

As the output current is increased, phase splitter transistor Q2 will come out of saturation and enter the linear region. This is Region V of the output curve which is characterized by high impedance, i.e., the output current changes very little with increasing output voltage. In this region the output current is equal to the current through the collector of pull-down transistor Q3 plus the current through SD1, or:

$$I_{02} = I_C Q3 + I_5.$$

When phase splitter transistor Q2 enters the linear range, the maximum value of $I_5$ becomes limited by $\beta$ times the base current to Q2 which is the current $I_1$, i.e.:

$$I_5 = \beta I_1.$$

Since Q3 is in its linear region, the Q3 collector current is $\beta$ times the Q3 base current, hence:

$$I_C Q3 = \beta I_4.$$

But, $$I_4 = I_E Q2 - I_3.$$

$$I_4 = (\beta+1)I_1 - I_3. \quad (4)$$

Therefore, $$I_{02} = \beta((\beta+1)I_1 - I_3) + \beta\beta.$$

$$I_{02} = \beta^2 I_1 + 2\beta I_1 = \beta I_3.$$

Since $2\beta I_1 - \beta I_3 << \beta^2 I_1$, for reasonable values of $\beta$, $$I_{02} \cong \beta^2 I_1. \quad (5)$$

Consequently, the highest current limited region of the device is limited by the square of the current gain of the transistors.

From this the characteristic output of the circuit of FIG. 1 has five operating regions, three of which are characterized by high impedances (Regions I, III, and V) and two of which are characterized by low impedances (Regions II and IV). Since the output structure shown in FIG. 1A is usually tied to a transmission line, the best performance is achieved by making the effective impedance of the output as low as possible. This is accomplished by establishing the low impedance regions at the lowest possible voltages. Since Region I is already as narrow as possible given other constraints on the characteristics of transistor Q3, the objective is to make Region III as narrow as possible, and to make Regions II and IV as wide as possible.

A problem with the conventional TTL output circuit 10 of FIG. 1 is that the power level P of the device is determined by $I_1$ and $I_2$.

$$P = V_{CC}(I_1 + I_2). \quad (6)$$

A large initial sinking current $I_{01}$ at the level for example shown in FIG. 1A requires a relatively small collector resistor R2 and relatively large collector current $I_2$ which increases the power consumption of the buffer. To reduce power dissipation, the collector resistor R2 is selected to be large and collector current $I_2$ small. As a result the initial sinking current $I_{01}$ is also small. To achieve the desired $\beta^2$ or high current sinking mode $I_{02}$ a higher corresponding output voltage $V_{02}$ for the logic low level or low potential signal $V_{OL}$ is required. At this level the low level output voltage $V_{02}$ is in the vicinity of the transition voltage $2V_{BE}$ of typical TTL buffers.

$$V_{02} \cong 2V_{BE}. \quad (7)$$

A disadvantage of the prior art TTL output buffer transition characteristic is that the low level output voltage $V_{02}$ corresponding to output sinking current $I_{02}$ in the high current sinking mode may not be unambiguously separated from the transition voltage threshold for TTL devices which is approximately $2V_{BE}$. As a result receivers or internal buffers on the transmission line or common bus coupled to the signal output 12 of output circuit 10 may not recognize the low level voltage signal $V_{OL}$ when a transmission line step occurs at level $V_{02}$ and will therefore experience transmission line delay. Furthermore the receivers or internal buffers may oscillate when $V_{02}$ is in the vicinity of $2V_{BE}$. It is desirable that $V_{02}$ look like a logic low or zero for switching the receivers on the transmission line or common bus. To assure unambiguous separation of the higher drive low level voltage signal $V_{02}$ at the signal output 12 below the switching threshold of $2V_{BE}$ the typical TTL output buffer 10 may require high power dissipation to increase the current $I_{01}$ at which pull-down transistor Q3 comes out of saturation. This will ensure that the transmission line step occurs at $V_{01}$ rather than $V_{02}$.

The TTL output buffer 10 of FIG. 1 is applicable for TTL bistate devices. For TTL tristate output devices capable of establishing a high impedance third state at the signal output 12, modification of the TTL output buffer is required as illustrated in FIG. 2. In the TTL tristate output buffer 20 illustrated in FIG. 2, elements corresponding in function to the TTL bistate output buffer 10 of FIG. 1 are indicated by the same reference designations. An enable signal input 16 is added for establishing the high impedance third state. In order to retain the feedback diodes SD1 and SD2 while also including the enable input 16, dual phase splitter transistors Q2 and Q2' are required, generally connected in current mirror configuration. In this configuration the emitters of dual phase splitter transistors Q2 and Q2' are coupled in parallel to the base of pull-down transistor Q3 for jointly controlling the conducting state of the pull-down transistor element. The bases of phase splitter transistors Q2 and Q2' are also tied together at the collector of input transistor Q1. The collector of the second phase splitter transistor Q2' is coupled through its own collector resistor R2' and diode SD2' to the power supply $V_{CC}$.

The enable input 16 is connected through diode SD4 to the base of the pull-up transistor element, Darlington transistor pair Q4A and Q4, for disabling the pull-up transistor element when a low level or a low potential enable signal E appears at the enable input 16. Enable input 16 is also tied through diode SD5 to the bases of the dual phase splitter transistors Q2 and Q2' so that they are also disabled by a low level enable input signal E. With phase splitter transistors non-conducting, the pull-down transistor Q3 is also disabled. As a result the tristate output device 20 constitutes a high impedance at the signal output 12 coupled to a transmission line or common bus and appears to receivers or internal buffers on the transmission line as if it were not there. The output device 20 operates in the normal bistate mode when a high level enable signal appears at the enable input 16.

The dual phase splitter transistors Q2 and Q2' are required so that only the collector of phase splitter transistor Q2 is connected to the base of the pull-up transistor element for controlling the conducting state of the pull-up transistor element. The enable input 16 is connected only to the collector of phase splitter transistor Q2. The collector of phase splitter transistor Q2' is not connected to the enable input 16. Rather, the feedback diodes SD1 and SD2 from the signal output 12 are coupled only to the collector of phase splitter transistor Q2'. There is no direct coupling therefore between the signal output 12 and the enable input 16 which would otherwise destroy the high impedance third state. Thus, the dual phase splitters Q2 and Q2' are required in the conventional tristate output buffer 20 in order to include both the enable input coupling 16 and the feedback diodes SD1 and SD2. The blocking diode SD2' blocks any current flow from the signal output 12 through the device to the power supply $V_{CC}$.

A disadvantage of the conventional tristate output buffer 20 in addition to the requirement that dual phase splitter transistors and accompanying circuit elements be included in the output buffer is that the full square law enhancement or $\beta^2$ step-up of the output current affording a high current sinking mode during transition from high to low level voltage at the signal output 12 may be lost. The loss of $\beta^2$ high current sinking mode may result because of "current hogging" of base drive current by phase splitter transistor Q2 while transistor Q2 is saturated. The dual phase splitter transistor Q2' which receives the feedback current through the feedback diodes SD1 and SD2 from the signal output 12 therefore has virtually no base drive when it enters the linear operating region. As a consequence, the collector current of Q2 is not determined by its current gain $\beta$, but rather by emitter current of Q2 in saturation when it is "hogging" the base drive to the pair of transistors Q2 and Q2'.

OBJECTS OF THE INVENTION

It is therefore an object of the present invention to provide a new TTl, output buffer circuit which maintains unambiguous separation of the final low level output voltage $V_{02}$ below the switching threshold $2V_{BE}$ while also maintaining the square law or $\beta^2$ high current sinking mode capability at the output. Another object of the invention is to deliver the high current sinking capability proportional to $\beta^2$ for both bistate and tristate devices while eliminating the need for dual phase splitter transistors and feedback diodes.

The invention seeks to provide an improved low power TTL output buffer circuit with low impedance output suitable for large capacitance applications such as coupling to a transmission line or common bus.

A further object of the invention is to provide a new multi-terminal transistor circuit structure for TTL current sinking and related applications such as "pulldown" circuit elements, with high current sinking capability.

DISCLOSURE OF THE INVENTION

In order to accomplish these results the present invention provides a new current sinking circuit structure with at least four terminals comprising a pair of transistors with the emitter of the second transistor coupled to the base of the first transistor. The collector of the first transistor is the first terminal of the circuit structure, the emitter of the first transistor is the second terminal, and the bases of the first and second transistors form respectively independent base drive third and fourth terminals. The collector of the second transistor may be coupled to the collector of the first transistor at the first terminal or to the high potential source $V_{CC}$ of a TTL circuit.

The invention is applied in an improved TTL, output buffer circuit having a signal input for receiving binary signals of high or low potential, a signal output for delivering binary signals of low or high potential in response to binary signals at the input, a pull-down transistor element for sinking current from the signal output to low potential, and a phase splitter transistor element having an emitter coupled to the base of the pull-down transistor element for controlling the conducting state of the pull-down transistor element. According to the invention the four terminal current sinking circuit structure is incorporated in the output adding a second buffer circuit by pull-down transistor element having the collector coupled to the signal output and emitter coupled to the base of the original pull-down transistor element. An independent base drive is coupled to the base of the second pull-down transistor element independent from the phase splitter transistor element.

A feature and advantage of the invention is that the second pull-down transistor element effectively constitutes a second stage pull-down transistor element introducing full square law enhancement or $\beta^2$ amplification of the output current in the high current sinking mode while eliminating the prior art feedback diodes between the signal output and the phase splitter transistor element.

The invention also provides independent base drive for the new pull-down transistor element or second stage pull-down transistor element. While a first input circuit element and base drive coupling couples the base of the phase splitter transistor element to the signal input, the invention provides a second input circuit element and base drive coupling between the base of the second pull-down transistor element and the signal input for providing base drive in response to signals at the input independent from the phase splitter transistor element. A feature and advantage of this arrangement is that "current hogging" by the phase splitter transistor element is avoided and the $\beta^2$ enhancement of sinking current by the new second stage pull-down transistor element is preserved.

According to another aspect of the invention the power level and power dissipation of the output buffer circuit is reduced by increasing the resistance of the collector resistor and decreasing the collector current of the phase splitter transistor thereby reducing the power level and power dissipation of the output while simultaneously shifting downward the initial step in the level of output current $I_{01}$. Furthermore, by reason of the new pull-down feedback transistor or second stage pull-down transistor according to the invention the final output current $I_{02}'$ is maintained at the same high current sinking level but at a reduced final low level output voltage $V_{02}'$ unambiguously separated from and below the switching threshold $2V_{BE}$.

The invention is also applied in tristate devices eliminating the requirement for dual phase splitter transistors and feedback diodes. Other objects features and advantages of the invention are apparent in the following specification and accompanying drawings.

DESCRIPTION OF PREFERRED EXAMPLE EMBODIMENTS AND BEST MODE OF THE INVENTION

Figure 1:
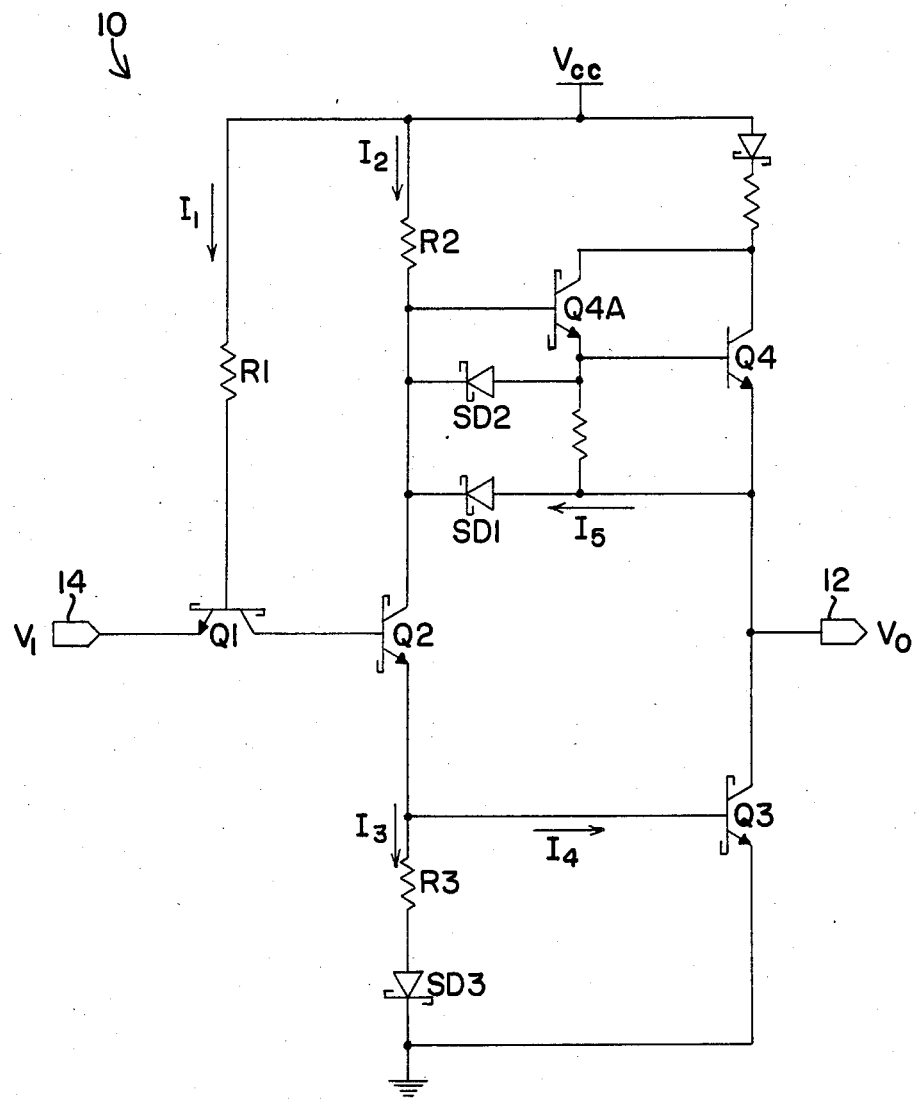
FIG. 1 is a schematic diagram of a prior art TTL bistate output buffer circuit.
Figure 3:
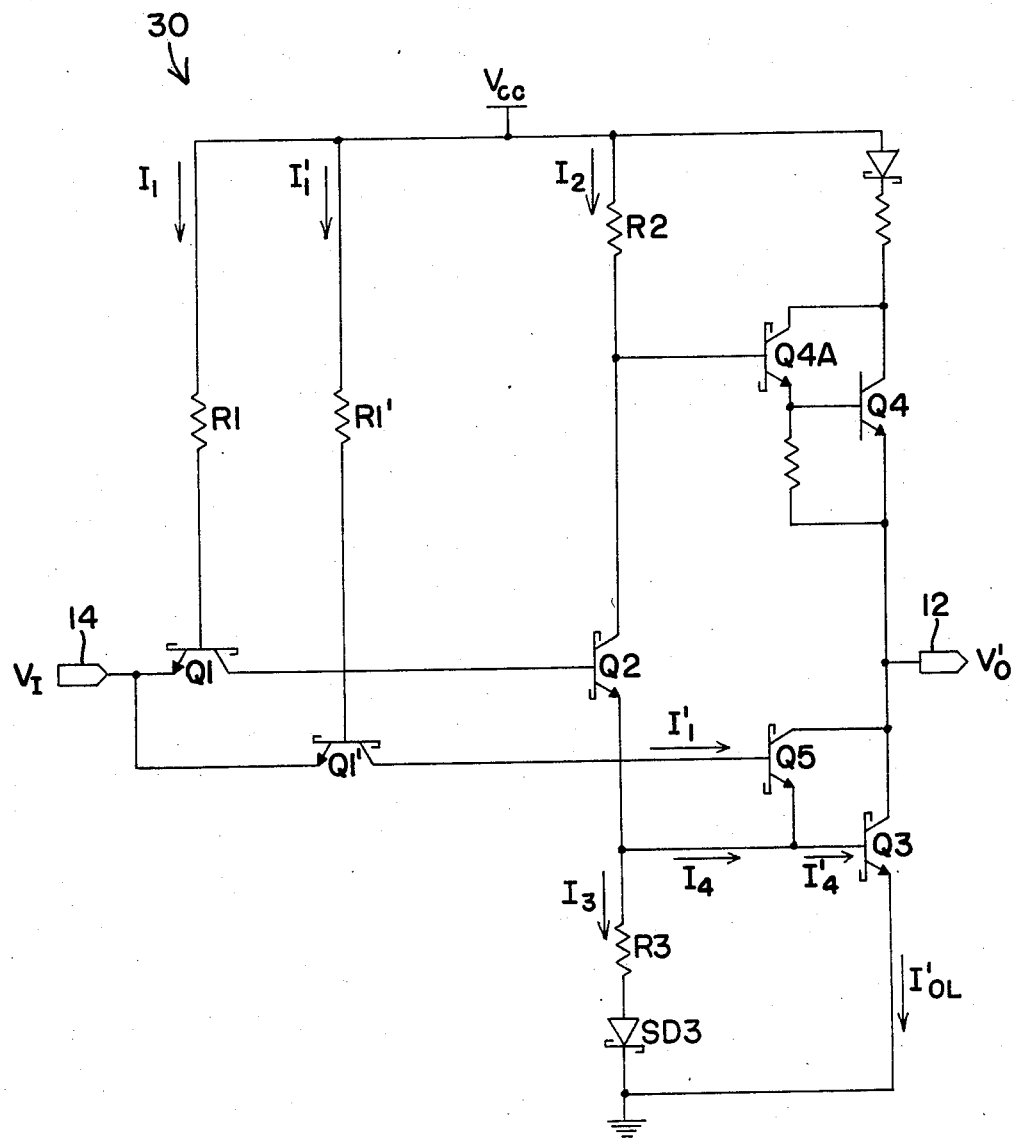
FIG. 3 is a schematic diagram of a TTL bistate output buffer circuit according to the present invention.

The improved TTL bistate output buffer circuit 30 according to the present invention is illustrated in Figure 3. Elements corresponding in function to the prior art TTL bistate output buffer circuit 10 of FIG. 1 are indicated by the same reference designations. In the new output circuit 30 there is added a second pull-down transistor element or a pull-down feedback transistor element Q5 having the collector coupled to the signal output 12 with the collector of transistor Q3, and emitter coupled to the base of the pull-down transistor Q3. The base of feedback transistor Q5 is coupled to the signal input 14 through a second input coupling transistor Q1' which delivers independent base drive to the base of feedback transistor Q5 from power supply $V_{CC}$ through base drive resistor R1' in response to the signals at the signal input 14. The pull down feedback transistor Q5 may also be controlled from a separate input source other than signal input 14 through input coupling transistor Q1'.

The pull-down feedback transistor element Q5 constitutes a second stage pull-down transistor element with the standard pull-down transistor Q3. The pull-down transistor element analogous to the pull-up transistor element Darlington transistor pair Q4A and Q4. The pull-down transistors Q5 and Q3 differ from the Darlington transistor pair, however, in that each of the transistors Q5 and Q3 is provided with independent sources of base drive. The new second stage or feedback pull-down transistor Q5 receives independent base drive through the input coupling transistor Q1'. This allows the output transistor Q3 to saturate, unlike a conventional Darlington. As a result, the collector of the pair of transistors Q3 and Q5 can go to a lower voltage than a conventional Darlington. In the embodiments of the invention herein described, the input coupling transistors Q1 and Q1' may of course be replaced by other equivalent input coupling circuit elements and arrangements frequently used such as, for example, input diode couplings rather than input transistors.

Figure 3A:
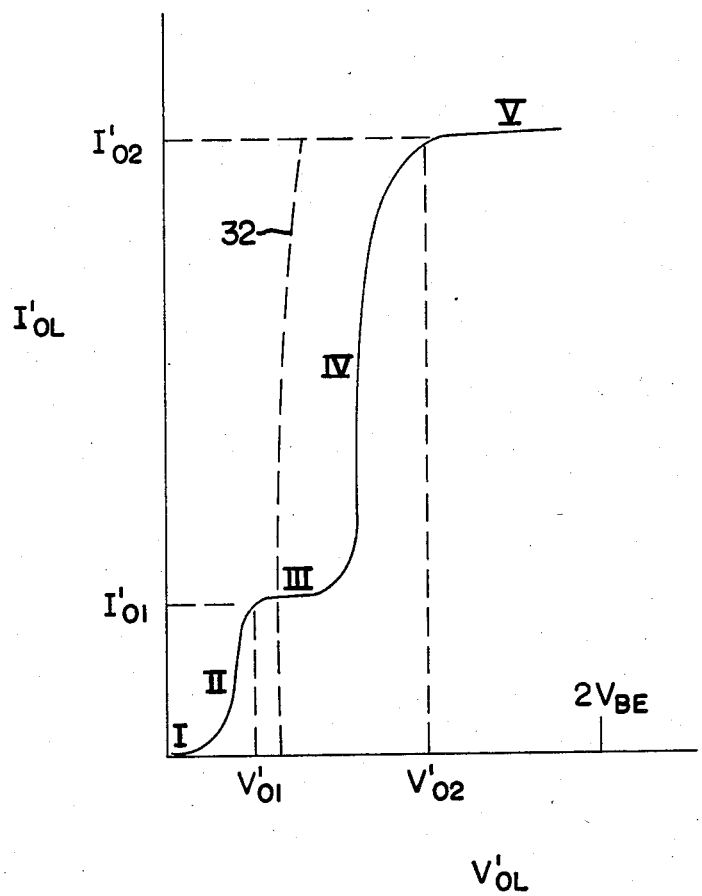
FIG. 3A is a graph of characteristic output sinking current versus output voltage in the low state at the signal output of the output buffer circuit of FIG. 3.

The graph of FIG. 3A illustrates the output current versus output voltage characteristics for the improved output buffer circuit 30 in the low state at the signal output. The two current sinking regions at $I_{01}'$ and $I_{02}'$ are still present but the output characteristics represent a lower effective impedance because $V_{02}'$ is a much lower voltage. As hereafter more fully analyzed, the improved circuit 30 decreases the initial or first step output sinking current $I_{01}'$, decreases the phase splitter collector current $I_2$, and thereby reduces the power level and power dissipation of the output circuit 30 when it is in the logic "0" or low level state. At the same time, however, the final output sinking current level $I_{02}'$ is maintained in the same high current sinking mode with square law or $\beta^2$ enhancement of the output sinking current by reason of the addition of the second stage or pull-down feedback transistor Q5. While maintaining the same high drive or high current sinking capacity, the higher drive low level output voltage $V_{02}'$ is reduced down to a value unambiguously below the switching threshold $2V_{BE}$ so that $V_{02}'$ looks like a logic "0" or low level potential for switching receivers on the transmission line or common bus.

Figure 1A:
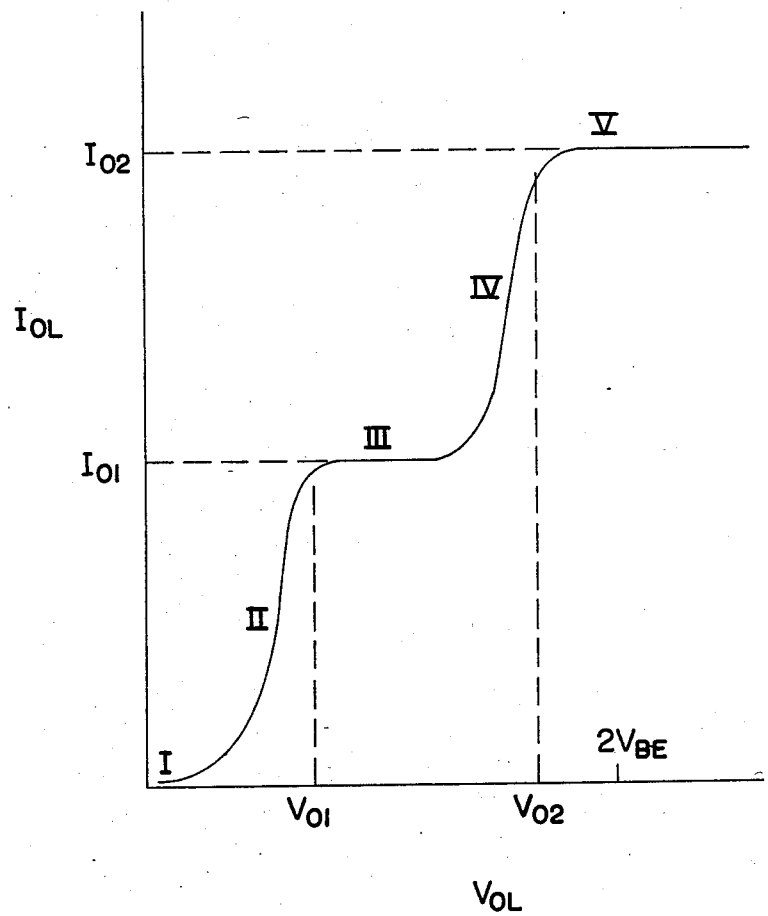
FIG. 1A is a graph of characteristic output sinking current versus output voltage in the low state at the signal output of the output buffer circuit of FIG. 1.
Figure 2:
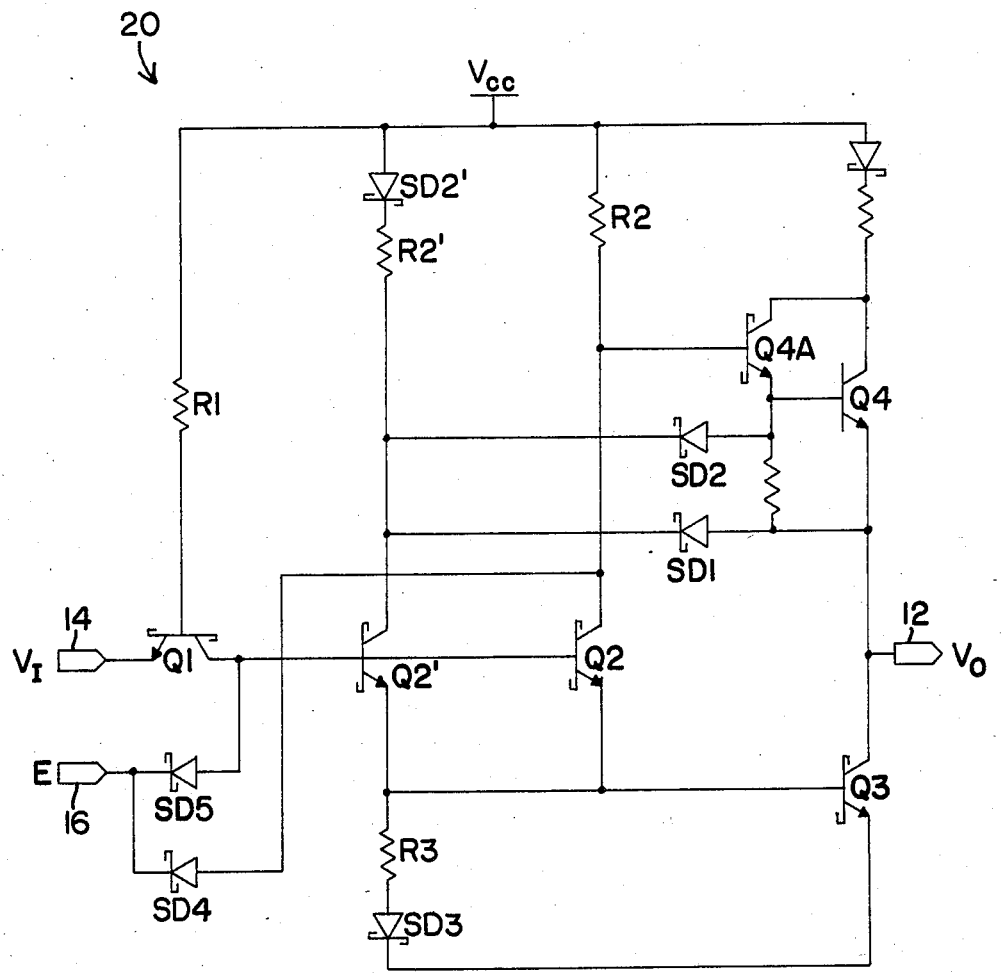
FIG. 2 is a schematic diagram of a prior art TTL tristate output buffer circuit.

Referring to the improved output circuit 30 of FIG. 3 and corresponding graph of output current vs. voltage (I–V) characteristics shown in FIG. 3A, the five distinct regions are visible that are present in the prior art circuit of FIGS. 1 and 1A. As before, the first Region I is at $I_{OL}'=0$ and is a very small region close to the horizontal axis. This corresponds to the offset region of pull-down transistor element Q3. After Region I, the I–V characteristics bends and rises nearly vertically corresponding to a low impedance region, in which the output voltage changes little with increasing output current. This is Region II and corresponds to the saturation region of pull-down transistor Q3. In this region, the output low-level voltage $V_{OL}$ is:

$$V_{01}' = V_{SAT}^{Q3}. \tag{8}$$

As the output current is further increased, the output characteristic enters a high impedance region where the output current increases very little as the output voltage is increased. This is Region III and corresponds to the linear region of pull-down transistor Q3. The output current in this region is:

$$I_{01}' = I_4' \tag{9}$$

$$I_{01}' = \beta(I_4 + I_1'),$$

where $$I_4 = I_1 + I_2 - I_3.$$

With further increase of the current, the output characteristic curve enters a second low impedance region that corresponds to the linear region of pull-down transistor Q3 and the saturation region of pull-down feedback transistor Q5, also referred to as the second stage pull-down transistor. This is a low impedance region and the output voltage in this region is given by the expression $$V_{02}' + V_{BE}^{Q3} + V_{SAT}^{Q5}. \tag{10}$$

As the output current is further increased, the output characteristic curve enters the high impedance Region V. This region is the linear region for both the second pull-down transistor Q5 and the original pull-down transistor Q3. The output current in this region is the sum of the collector currents of both transistors Q3 and Q5. Since both transistors are linear, the collector currents are the current gain, $\beta$, times the respective base currents.

$$I_{02}' = \beta I_1' + \beta I_4'.$$

But, $$I_4' = I_4 + I_E Q5,$$

$$I_4' = I_4 + (\beta + 1)I_1'$$

Thus $$I_{02}' = \beta I_1' + \beta(I_4 + (\beta+1)I_1')$$

$$I_{02}' = \beta^2 I_1' + \beta(2I_1' + I_4) \qquad (11)$$

It is an advantageous result that the second stage pull-down transistor Q5 assures square law amplification or $\beta^2$ enhancement of the output sinking current for operation in the high current sinking mode.

From this analysis, the circuit of the present invention has five distinct operating regions as does the prior art circuit. Furthermore, the Regions II and IV are low impedance regions while Regions I, III and V are high impedance regions. In the present invention however, both of the low impedance regions II and IV occur at or below $$V_{02}' = V_{BE}Q3 + V_{SAT}Q5,$$

which is a significantly lower voltage than the prior art circuit where:

$$V_{02} = V_{BE}Q3 + V_{SAT}Q2 + V_{SD1}$$

This is a significant result because when this output device is connected to transmission lines with low impedance, the transmission line step in the output signal during switching from high to low will occur at $V'_{02}$. In the present invention we note that $$V_{02}' << 2V_{BE} \qquad (12)$$

While in the prior art, $$V_{02} \approx 2V_{BE}.$$

In the new circuit of the present invention the final low level output voltage $V_{02}'$ is unambigously separated from the switching threshold $2V_{BE}$.

For example, a typical switching threshold or transition voltage for TTL output circuit equal to $2V_{BE}$ is approximately 1.6 volts with the logic "1" or high level signal being greater than 1.6 volts, for example 2 to 2.5 volts with a static high of 3 volts at room temperature. The present invention provides a dynamic low level voltage $V_{02}'$ during transition from high to low level voltage at the output of approximately 1.1 volts clearly below the switching threshold. The static low level voltage following transistion is typically 0.5 volts. The power level and power dissipation P' of the output circuit 30 is $$P' = V_{CC}(I_1 + I_1' + I_2) \qquad (13)$$

and can be substantially reduced by increasing the phase splitter collector resistor R2, reducing the phase splitter capacitor current $I_2$.

Thus, the invention reduces the power of the buffer and reduces the output impedance as low as possible while shifting the low level output characteristic line shown in the graph of FIG. 3A to the left to approach an ideal characteristic transition line 32.

Figure 4:
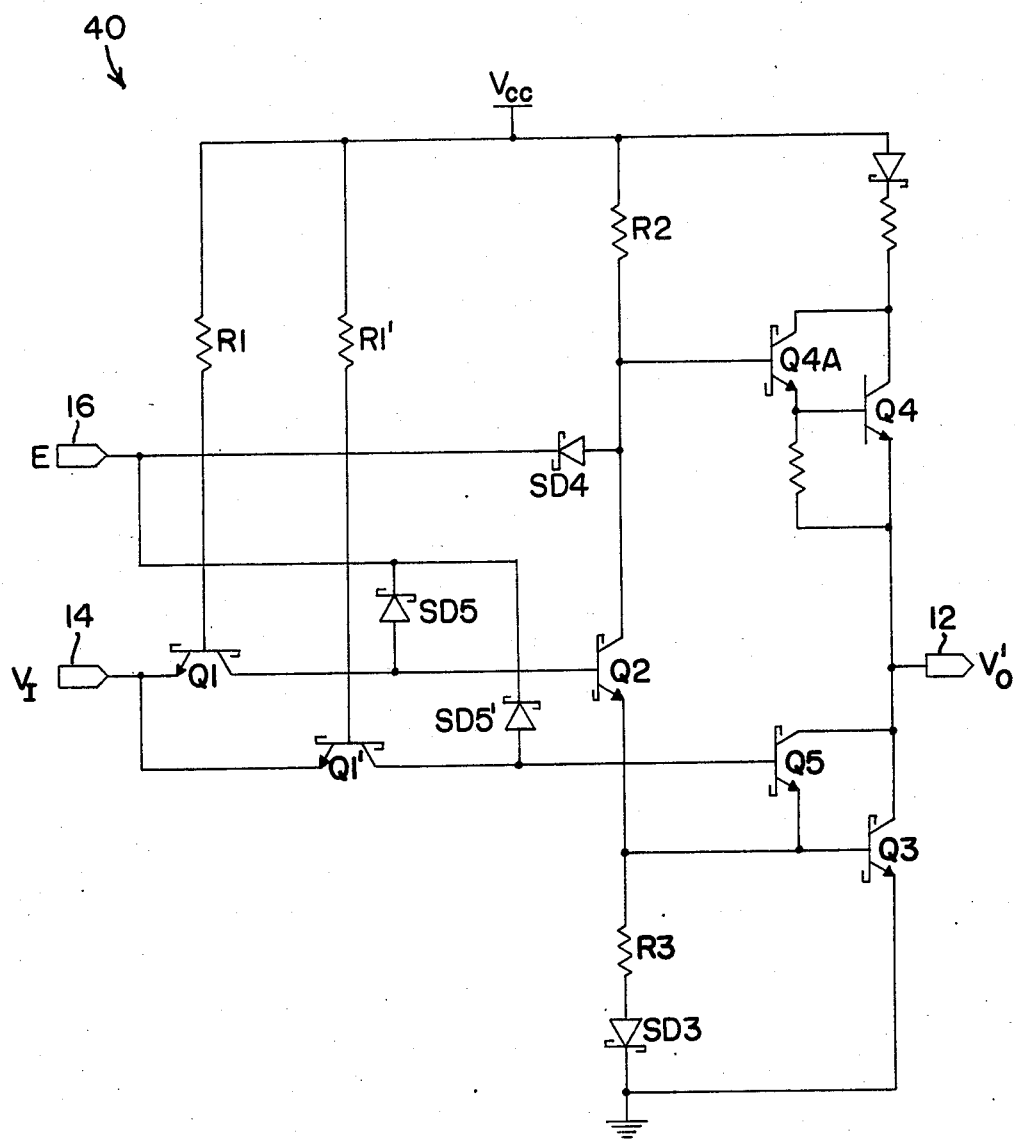
FIG. 4 is a schematic diagram of a TTL tristate output buffer circuit according to the present invention.

Application of the present invention in a TTL tristate output circuit 40 is illustrated in FIG. 4. Elements corresponding in function to the TTL bistate output buffer circuit 30 of FIG. 3 are indicated by the same reference designations. The enable input 16 to enable the high impedance third state is coupled through Schottky diode SD4 to the base of the pull-up transistor element, Darlington transistor pair Q4A and Q4, for disabling the pull-up transistor element when a low level or logic 0 enable signal E appears at the enable input 16. The enable input 16 is also tied through Schottky diode SD5 to the base of the phase splitter transistor Q2 and through Schottky diode SD5' to the base of feedback transistor Q5 so that the phase splitter transistor Q2, feedback transistor Q5, and pull-down transistor Q3 are disabled by a low level enable input signal E. As a result, the tristate output circuit 40 constitutes a high impedance on the transmission line coupled to signal output 12 when the output is in the third state.

With a high level signal at enable input 16 and with the tristate output device 40 operating in the bistate mode, the square law amplification or $\beta^2$ enhancement of the output sinking current $I_{OL}'$ is maintained during transition from high to low at the signal output 12. Furthermore, this is accomplished without the traditional feedback diodes and without dual phase splitter transistors by reason of the novel second stage or pull down feedback transistor element Q5. The present invention thus eliminates the need for either feedback diodes or dual phase splitters transistors in the tristate output circuit. Of course, dual phase splitter transistors and feedback diodes may be included for other purposes but are no longer necessary to maintain the high current sinking mode capability.

Figure 4A:
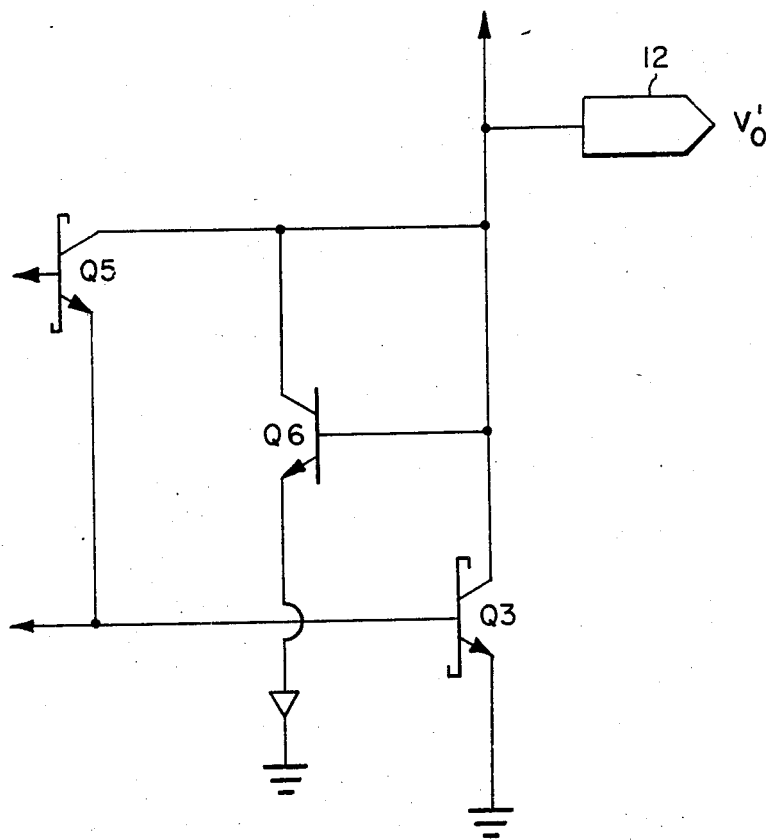
FIG. 4A is a fragmentary portion of the TTL tristate output circuit of FIG. 4 showing the first and second pull-down transistor elements in an alternative embodiment with a sinking current set transistor.

It may also be advantageous to add a sinking current set transistor Q6 having the base coupled to the signal output 12, collector coupled to the base of the second stage pull-down transistor Q5, and emitter coupled through a diode to ground or low potential, as shown in FIG. 4A. Such a transistor element sets the sinking current level $I_{02}'$ and reduces $\beta$ dependence.

Figure 5:
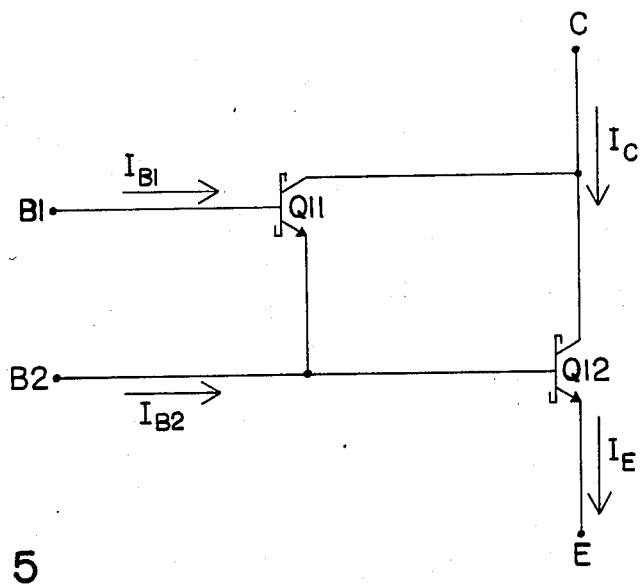
FIG. 5 is a schematic diagram of a four terminal current sinking transistor circuit structure according to the present invention.

FIG. 5 shows the basic circuit structure that is fundamental to this invention. It is a four terminal circuit device consisting of a common collector C, the base B1 of a first stage transistor Q11, the base B2 of a second stage transistor Q12, and the emitter E of the second stage transistor Q12. The device is similar to the familiar Darlington transistor pair but is unique in that it has two independent base connectors B1 and B2. This gives the device two distinct saturation regions. There is a low voltage saturation region in which current $I_{B2}$ is sufficiently high to cause transistor Q12 to saturate. In this condition the voltage from C to E of the device is:

$$V_{CE1} = V_{SAT}Q12. \qquad (14)$$

The second saturation region occurs when $I_{B2}$ is insufficient to saturate Q12 but $I_{B1}$ is sufficient to saturate Q11. This gives rise to a voltage from C to E across the device of $$V_{CE2} = V_{BE}Q12 + V_{SAT}Q11. \qquad (15)$$

By independently controlling the currents $I_{B1}$ and $I_{B2}$ with a fixed load current $I_C$ the voltage from C to E can be varied between two well defined discrete levels.

Similarly, there are two distinct linear regions of operation. The first region lies between $V_{CE1}$ and $V_{CE2}$ and corresponds to a sink current of $$I_{C1} = \beta I_{B2} \qquad (16a)$$

This equation assumes $I_{B1}$ is small compared to $I_{B2}$. If it is not, the sink current will actually vary from $$I_{C1}' = \beta I_{B2} - I_{B1} \qquad (16b)$$

near $V_{CE1}$ to $$I_{C1}'' = \beta(I_{B2} + I_{B1}) \quad (16c)$$

near $V_{CE2}$.

The second linear region lies above $V_{CE2}$ and corresponds to $$I_{C2} = \beta[I_{B2} + (\beta+1)I_{B1}]$$
$$I_{C2} = \beta^2 I_{B1} + \beta(I_{B1} + I_{B2}). \quad (17)$$

Figure 6:
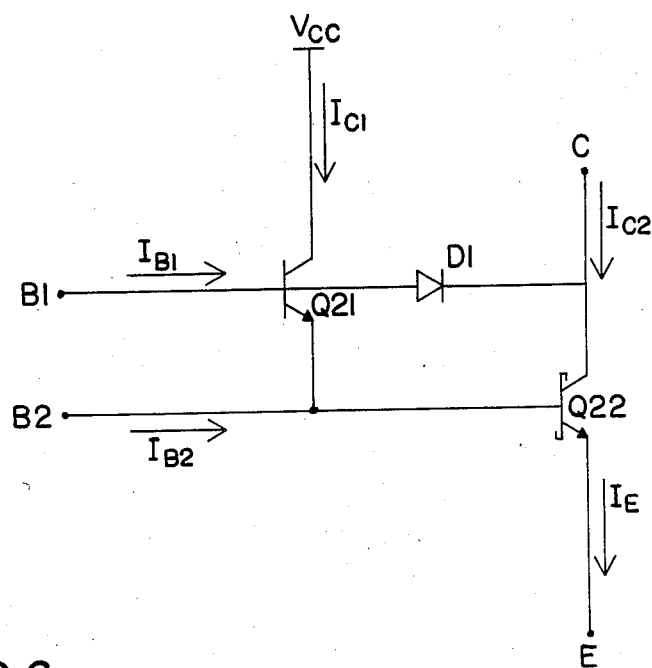
FIG. 6 is a schematic diagram of an alternative four terminal current sinking transistor circuit structure.

FIG. 6 shows an alternate circuit according to the invention for achieving the characteristic I-V curve of output sinking current versus output voltage in the low state shown in FIG. 3A. The operation of the circuit of FIG. 6 is similar to the circuit shown in FIG. 5. When base currents are applied to both the transistors Q21 and Q22 and $I_{B2}$ is sufficient to saturate transistor Q22, the voltage from C to E is $$V_{CE1} = V_{SAT}Q22. \quad (18)$$

In this condition transistor Q21 is off because all of its base current, $I_{B1}$ is diverted through diode D1 into the collector of transistor Q22. A second saturation region occurs when $I_{B2}$ is insufficient to saturate Q22. The collector C to emitter E voltage will rise until the $I_{B1}$ current is diverted into the base of Q21. Since the collector of Q21 is tied to a positive supply voltage which is high enough to prevent Q21 from saturating, there is a large increase in base current $I_{B1}$ to Q21. This occurs at a voltage:

$$V_{CE2} = V_{BE}Q22 + V_{BE}Q21 - V_{D1}. \quad (19)$$

Between $V_{CE1}$ and $V_{CE2}$ lies a linear region of operation characterized by a constant sink current $I_{C1}$ given by the expression $$I_{C1} = \beta I_{B2}, \quad (20a)$$

assuming $I_{B1}$ is much smaller than $I_{B2}$. If the effect of $I_{B1}$ is not negligible, then the correct expression for $I_{C1}$ will be $$I_{C1} = \beta I_{B2} - I_{B1}. \quad (20b)$$

A second linear region lies above $V_{CE2}$ and is characterized by a sink current $I_{C2}$ given by the expression $$I_{C2} = \beta[I_{B2} + (\beta+1)I_{B1}]$$
$$I_{C2} = \beta^2 I_{B1} + \beta(I_{B1} + I_{B2}) \quad (21)$$

Note the similarity between equations 14 and 18, between equations 16a and 20a, and between equations 17 and 21. There are only two significant differences between the circuits in FIGS. 5 and 6. First, the second saturation region $V_{CE2}$ occurs at a lower voltage in the circuit in FIG. 6 where $V_{CE2} = V_{BE}Q22 + V_{BE}Q21 - V_{D1} \cong V_{BE}$ than in the circuit in FIG. 5 where $V_{CE2} = V_{BE}Q12 + V_{SAT}Q11$. This lower value of $V_{CE2}$ improves the line driving characteristic of the circuit in FIG. 6 as compared with FIG. 5.

The second difference between the two circuits is that the circuit in FIG. 6 derives its extra base drive from $V_{CC}$ to provide the high sinking mode of $I_{C2}$. The circuit in FIG. 5 generates the extra base drive current for the high current sinking mode from its own output.

The circuit in FIG. 6 therefore draws more power than the circuit in FIG. 5 to achieve the high current sinking operating mode. A further advantage for the circuit in FIG. 6, however, is that transistor Q22 is biased so that it cannot saturate. It therefore does not have to be Schottky clamped in Schottky transistor designs. This allows a smaller transistor to be used. In the alternative four terminal current sinking transistor circuit structure of FIG. 6, the collector of transistor Q21 is coupled to the high level voltage source $V_{CC}$ of a TTL circuit rather than to the collector of transistor Q22 and terminal C. In this arrangement, a diode D1 couples the base of transistor Q21 to the collector of transistor Q22 and terminal C.

As shown in FIG. 6 and subsequently in FIGS. 7 and 8, the low resistance conducting direction of diode D1 is oriented to conduct in the direction from the base of the second pull-down transistor Q21 to the collector of the first pull-down transistor Q22.

Figure 7:
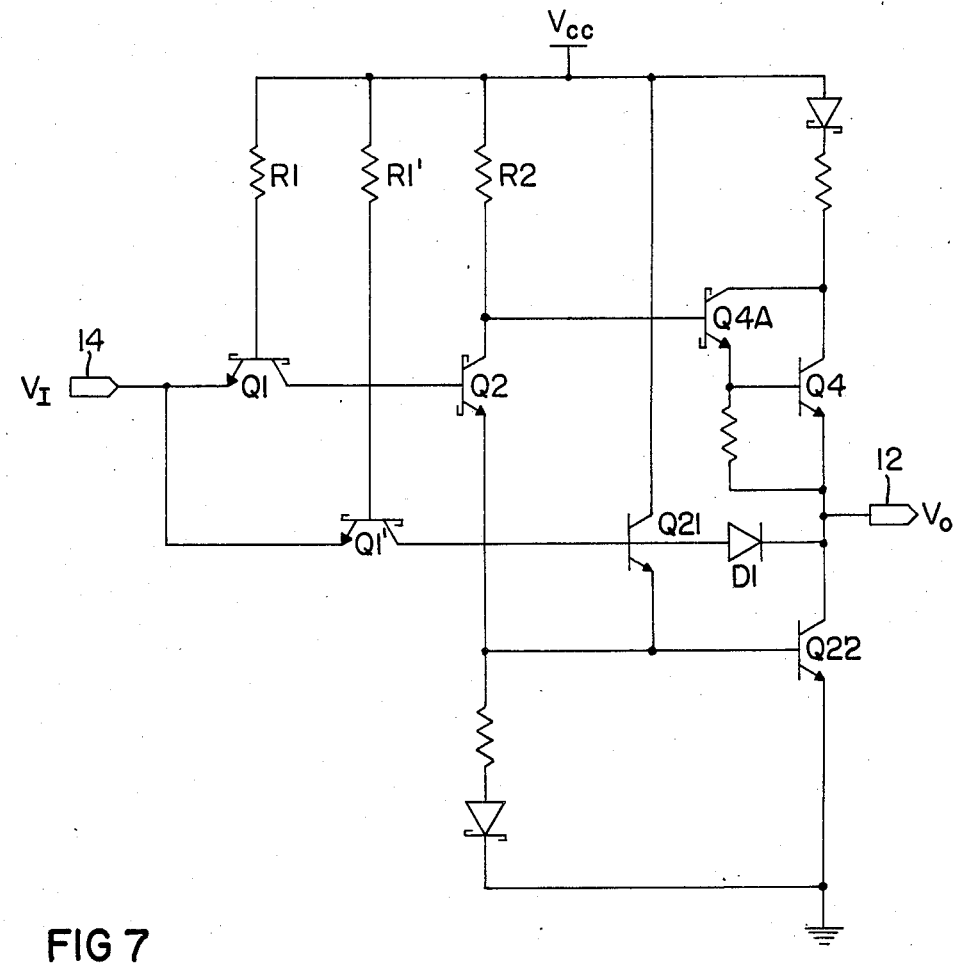
FIGS. 7 and 8 are schematic diagrams respectively of bistate and tristate TTL output buffer circuits incorporating the four terminal current sinking circuit structure of FIG. 6 as a "pull-down" transistor circuit element.
Figure 8:
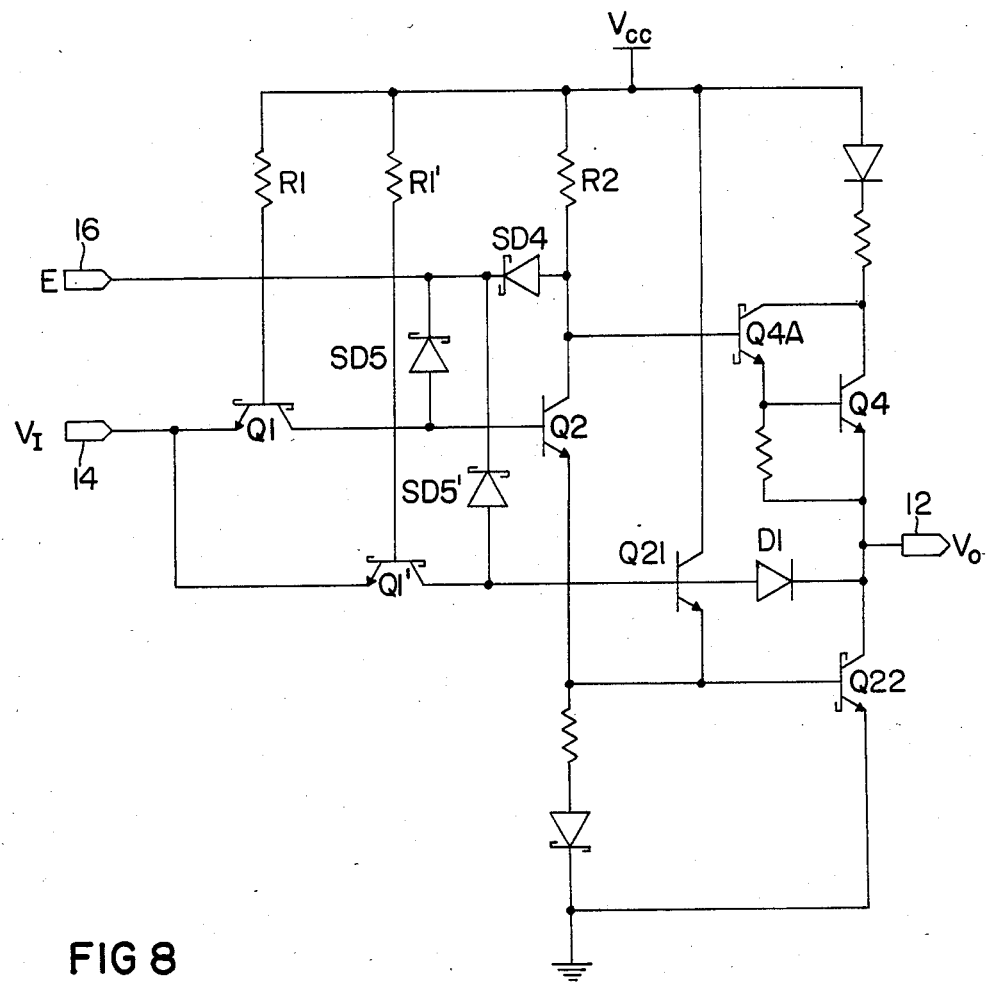

FIG. 7 shows the circuit of FIG. 6 applied in a bistate output buffer circuit similar to FIG. 3 with corresponding components indicated by the same reference designations and FIG. 8 shows the circuit of FIG. 6 applied in a tristate output buffer circuit similar to Fig. 4 with corresponding elements indicated by the same reference designations.

A feature and advantage of the multi-terminal transistor circuit structures of FIGS. 5 & 6 according to the invention is that the independent base terminals provide separate current controlled inputs for two levels of voltage output either $V_{SAT}$ or $V_{SAT} + V_{BE}$ at the collector terminal C in addition to a third voltage level provided by source voltage $V_{CC}$. Additional stages may be added to the circuit structure, for example a third transistor coupled to the second transistor in the same manner as the second transistor is coupled to the first transistor. With three independent base terminals or current controlled inputs, multi-level voltage outputs can be achieved, e.g. $V_{SAT}$, $V_{SAT} + V_{BE}$, $V_{SAT} + 2V_{BE}$, $V_{CC}$, etc., for multi-valued logic applications, analog to digital converters, etc.

As used herein and in the following claims, the phrases transistor, transistor element, and transistor means refer to a three terminal or three electrode bipolar transistor component or device having for its three terminals a collector, base and emitter as shown in each of the FIGS. 3-7.

While the invention has been described with reference to particular example embodiments, it is intended to cover all modifications and equivalents incorporating the new four terminal current sinking transistor circuit structure and applications within the scope of the following claims.

We claim:

1. An improved TTL output buffer circuit for digital data transmission comprising:
   a signal input for receiving binary data signals of high or low potential;
   a signal output for delivering binary data signals of low or high potential in response to binary data signals at the input;
   a pull-up transistor element for sourcing current from high potential ($V_{cc}$) to the signal output;
   a first pull-down transistor element for sinking current from the signal output to low potential;
   a phase splitter transistor element having an emitter coupled to the base of the first pull-down transistor element for controlling the conducting state of the first pull-down transistor element, said phase splitter transistor element having a collector coupled to the base of said pull-up transistor element;

first base drive means coupling the base of the phase splitter transistor element to the signal input;

a second pull-down transistor element having the collector coupled to the collector of the first pull-down transistor element at the signal output and the emitter coupled to drive the base of the first pull-down transistor element for square law enhancement and amplification of sinking current by the first pull-down transistor element;

and second base drive means coupling the base of the second pull-down transistor element to the signal input for providing base drive independent from the first base drive means in response to binary data signals at the signal input.

2. The TTL output buffer circuit of claim 1 comprising an enable input circuit element coupled to the base of the phase splitter transistor element and to the base of the second pull-down transistor element to enable a high impedance third state.

3. The TTL output buffer circuit of claim 2 wherein the phase splitter transistor element consists of a single phase splitter transistor.

4. The TTL output buffer circuit of claim 1 further comprising a sinking current set transistor element having the base coupled to the signal output, collector coupled to the base of the second pull-down transistor element and emitter coupled to low potential.

5. A TTL output circuit for digital data transmission comprising:

a signal input for receiving binary data signals of low or high potential;

a signal output for delivering binary data signals of high or low potential;

a first pull-down transistor element for sinking current from the signal output to low potential;

a pull-up transistor element for sourcing current from high potential ($V_{ee}$) to the signal output;

a phase splitter transistor element having an emitter coupled to the base of the first pull-down transistor element for controlling the conducting state of the first pull-down transistor element, said phase splitter transistor element having a collector coupled to the base of said pull-up transistor element;

first base drive means coupling the base of the phase splitter transistor element to the signal input;

a second pull-down transistor element having an emitter coupled to drive the base of the first pull-down transistor element for square law enhancement and amplification of sinking current by the first pull-down transistor element;

and second independent base drive means coupling the base of the second pull-down transistor element to the signal input for providing base drive independent from the first base drive means in response to binary data signals at the signal input.

6. The TTL output circuit of claim 5 comprising an enable input coupled to the base of the phase splitter transistor element and to the base of the second pull-down transistor element to enable a high impedance third state.

7. The TTL output circuit of claim 6 wherein the phase splitter transistor element consists of single phase splitter transistor.

8. The TTL output circuit of claim 5 wherein the collector of the second pull-down transistor element (Q21) is independently coupled to high potential (V ).

9. The TTL output circuit of claim 8 wherein the second pull-down transistor element (Q21) is coupled in emitter-follower configuration.

10. The TTL output circuit of claim 8 further comprising a diode (D1) coupled between the base of the second pull-down transistor element (Q21) and the collector of the first pull-down transistor element (Q22) said diode (D1) having a low resistance conducting direction oriented to conduct from the base of the second pull-down transistor element (Q21) to the collector of the first pull-down transistor element (Q22).

11. The TTL output circuit of claim 5 wherein the collector of the second pull-down transistor element (Q5) is coupled to the collector of the first pull-down transistor element (Q3) at the signal output.

12. A multi-terminal transistor circuit comprising:

first and second transistors, the emitter of the second transistor being coupled to drive the base of the first transistor for square law enhancement and amplification of current by the first transistor, the collector of the first transistor comprising a first terminal, the emitter of the first transistor comprising a second terminal, and the bases of the first and second transistors comprising independent base drive third and fourth terminals, the collector of the second transistor being coupled to a source of high potential ($V_{cc}$) in emitter-follower configuration, and a diode coupled between the base of the second transistor and the collector of the first transistor said diode having a low resistance conducting direction oriented to conduct from the base of the second pull-down transistor element to the collector of the first pull-down transistor element.

13. The circuit of claim 4 further comprising first and second independent base drive means coupled respectively to the bases of the first and second transistors at the third and fourth terminals.

14. The circuit of claim 12 further comprising first and second independent base drive means coupled respectively to the bases of the first and second transistors at the third and fourth terminals.

* * * * *